United States Patent [19]
Kim et al.

[11] Patent Number: 6,081,159
[45] Date of Patent: Jun. 27, 2000

[54] APPARATUS FOR IMPROVING LINEARITY OF SMALL SIGNAL

[75] Inventors: Chung Hwan Kim; Cheon Soo Kim; Hyun Kyu Yu; Yeong Cheol Hyeon; Min Park, all of Daejeon, Rep. of Korea

[73] Assignee: Electronics and Telecommunications Research Institute, Daejeon, Rep. of Korea

[21] Appl. No.: 09/164,358

[22] Filed: Oct. 1, 1998

[30] Foreign Application Priority Data

May 23, 1998 [KR] Rep. of Korea ........................ 98-18711

[51] Int. Cl.$^7$ ....................................................... H03F 1/26
[52] U.S. Cl. ............................ 330/149; 330/277; 330/294
[58] Field of Search ..................................... 330/110, 149, 330/277, 294, 302, 85

[56] References Cited

U.S. PATENT DOCUMENTS

| | | | |
|---|---|---|---|
| 4,011,518 | 3/1977 | Irvine et al. | 330/277 |
| 4,438,410 | 3/1984 | Orne | 330/149 |
| 5,315,265 | 5/1994 | Wisherd et al. | 330/289 |

OTHER PUBLICATIONS

Hitoshi Hayashi et al. "A Self Phase Distortion Compensation Technique for Linear Power Amplifiers", 1994 Asia Pacific Microwave Conference, pp. 555–558.

G. Passiopoulos et al., "Effect of bias and load on MESFET nonlinear characteristics", Electronics Letters, 11$^{th}$ Apr. 1996, vol. 32, No. 8, pp. 741–743.

Stephen A. Maas et al., "Modeling MESFET's for Intermodulating Analysis of Mixers and Amplifiers", 1990 IEEE.

Toshio Nojima et al., "Cuber Predistortion Linearizer for Relay Equipment in 800 MHz Band Land Mobile Telephone System", 1986 IEEE, pp. 169–177.

R.D. Stewart, "Feedforward Linearisation of 950 MHz Amplifiers", IEEE Proceedings, vol. 135, Pt. H., No. 5, Oct. 1998, pp. 347–350.

Shoji Otaka, "A very low offset 1.9–Ghz Si mixer for direct conversion receivers", 1997 Symposium on VLSI Circuits Digest of Technical Papers, pp. 89–90.

Primary Examiner—Robert Pascal
Assistant Examiner—Khanh Van Nguyen
Attorney, Agent, or Firm—Jacobson, Price, Holman & Stern, PLLC

[57] ABSTRACT

An apparatus for improving linearity of small signal according to the present invention comprises a least of one non-linear signal generating means for receiving a first DC bias larger than a threshold voltage and for generating a non-linear signal; feedback means for returning the non-linear signal from said a least of one non-linear signal generating means; and amplifying means for receiving, amplifying and outputting to an output unit, a second DC bias larger than the threshold voltage and a reversed and feedback non-linear signal such that the non-linear signal is cancelled. The linearizers according to the present invention have a higher linearity and a simple constitution, and thereby being used for various terminals.

9 Claims, 7 Drawing Sheets

APPARATUS FOR IMPROVING LINEARITY OF SMALL SIGNAL

BACKGROUND OF THE INVENTION

1. Technical Field of the Invention

The present invention relates to an apparatus for improving linearity of small signal, more specifically relates to an apparatus for improving linearity of small signal which is used for transmitter and receiver.

2. Description of the Prior Art

FIGS. 1 to 3 show linearizers according to prior arts

FIG. 1 shows a block diagram illustrating a linearizer using a general predistortion method.

Referring FIG. 1, the linearizer includes a divider 110, a third-order distortion generator 120, an amplitude & phase controller 130 and a coupler 140.

The divider 110 divides an input signal from outside to two signals. One divided signal is directly transferred to the coupler 140. And the other is transferred to the coupler 140 via the third-order distortion generator and the amplitude & phase controller 130. The third-order distortion generator generates the third-order distortion signal. The amplitude & phase controller 130 receives the signal from the third-order distortion generator 120 and controls amplitude and phase of the third-order distortion signal. The coupler 140 combines the input signal from the divider 110 and the third-order distortion signal from the amplitude & phase controller 130, such that the third-order distortion of the input signal is cancelled.

FIG. 2 shows a block diagram illustrating a linearizer using a general feed-forward cancellation method.

Referring to FIG. 2, the linearizer includes a divider 210, a first amplifier 220, a directional coupler 230, a subtracter 240, a second amplifier 250 and an adder 260.

The divider 210 divides an input signal from outside to two signals. One divided signal is transferred to the first amplifier 220 and the other is transferred to the subtracter 240. When the signal is amplified in the first amplifier 220, the signal is distorted. The output signal from the first amplifier 220 including distortion is transferred to the subtracter 240 and the adder 260 via the directional coupler 230.

When the subtracter 240 subtracts the amplified and distorted signal, outputted from the first amplifier 220, from the output signal of the divider 210, the signal from the divider 210 and amplification of the output signal from the first amplifier 220 are cancelled and distortion of the output signal from the first amplifier 220 is reversed. The reversed and distorted signal is amplified by the second amplifier and transferred to the adder 260.

The adder 260 adds distorted and amplified signal from the first amplifier 220 to the amplified and reversed distortion signal from the second amplifier 250. At this time, distortion of the output signal from the first amplifier 220 and the reversed distortion signal from the second amplifier 250 are cancelled, such that only signal amplified by the first amplifier is outputted to outside.

For example, we suppose that signal "all" is transferred to the first amplifier 220 and the subtracter 240, the first amplifier 220 outputs the amplified signal "a" and the distortion signal "b". The subtracter 240 subtracts the amplified signal "all" and the distortion signal "b" from the signal "a", thereby cancelling the signal "all" and the amplified signal "all" and outputting the reversed signal "–b". The adder 260 adds the amplified signal from the first amplifier 220 and the distortion signal "b" to the reversed distortion signal "–b" from the subtracter 240, thereby cancelling the distortion signal "b" and the reversed distortion signal "–b" and outputting only the amplified signal "a" to outside.

FIG. 3 shows a block diagram illustrating a linearizer using a general Cartesian-feedback method.

Referring to FIG. 3, the linearizer includes a first amplifier 310, a directional coupler 320, an amplitude & phase controller 330, a filter 340 and a second amplifier 350.

The first amplifier 310 amplifies the input signal from outside and outputs the amplified signal to the directional coupler 320. At this time, the amplified signal includes distortion signal which is created during amplification.

The amplified signal and the distortion signal from the first amplifier 310 is transferred to the second amplifier 350 and the amplitude & phase controller 330 through the directional coupler 320. The amplitude & phase controller 330 controls amplitude and phase of the amplified signal and reverse and transfers the distortion signal to the filter 340.

The filter 340 filters the amplified signal and the reversed distortion signal and transmits the filtered signal to the first amplifier 310. Then, the first amplifier 310 amplifies the amplified signal from the filter 340. The amplified signal is outputted to outside through the directional coupler 320. At this time, the distortion signal created in the first amplifier 310 is offset and cancelled by the reversed distortion signal from the filter 340. In this case, the distortion signal is cancelled by using the reversed distortion signal created in feedback loop.

The linearizers mentioned above may be used for a base station, but cannot be used for a small, low power and high effect terminal because of complexity and large scale of the circuit.

SUMMARY OF THE INVENTION

Therefore, an object of the present invention is to an apparatus for improving linearity of small signal which generates non-linear signal having the reversed phase with that of the amplified small signal and cancels the amplified small signal.

According to the first aspect of the present invention, this object is accomplished by providing an apparatus for improving linearity of small signal comprising: a least of one non-linear signal generating means for receiving a first DC bias larger than a threshold voltage and for generating a non-linear signal; feedback means for returning the non-linear signal from said a least of one non-linear signal generating means; and amplifying means for receiving, amplifying and outputting to an output unit, a second DC bias larger than the threshold voltage and a reversed and feedback non-linear such that the non-linear signal is offset.

BRIEF DESCRIPTION OF THE DRAWINGS

Other objects and aspects of the invention will become apparent from the following description of the embodiments with reference to the accompanying drawings in which.

DETAILED DESCRIPTION OF THE PREFERRED EMBODIMENTS

The embodiments of the present invention will be described with reference to the accompanying drawings, FIGS. 4 to 8.

Figure 1:
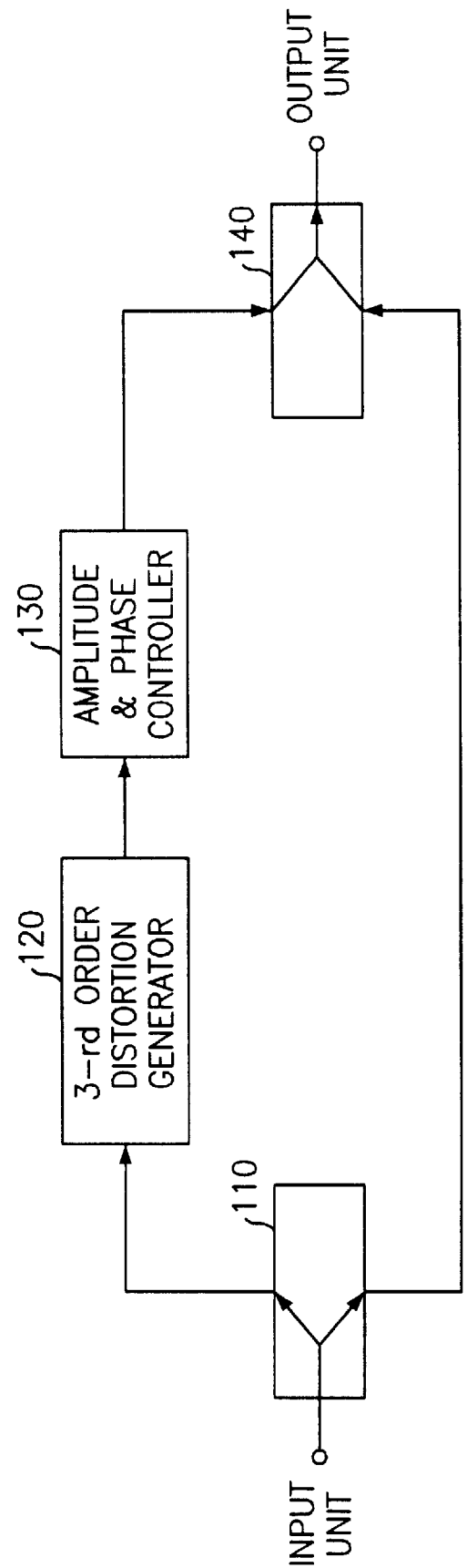
FIG. 1 is a block diagram illustrating a linearizer using a general predistortion method.
Figure 2:
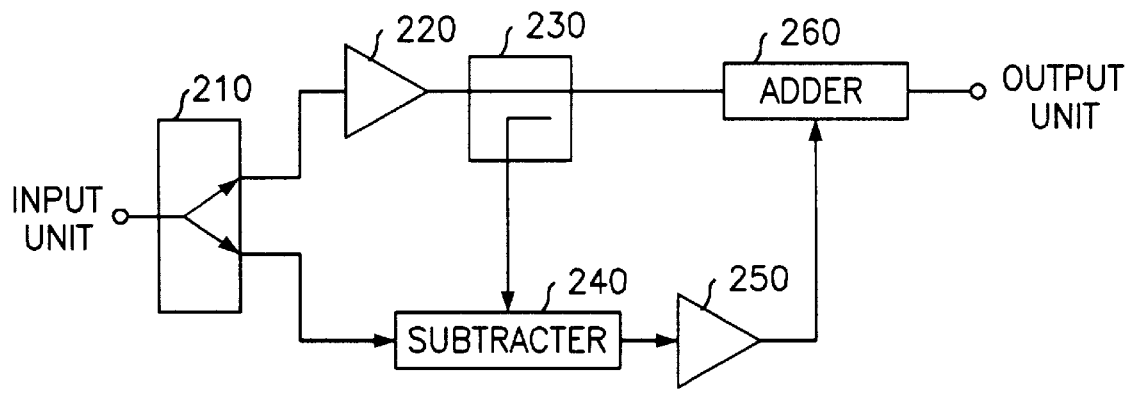
FIG. 2 is a block diagram illustrating a linearizer using a general feed-forward-cancellation method.
Figure 3:
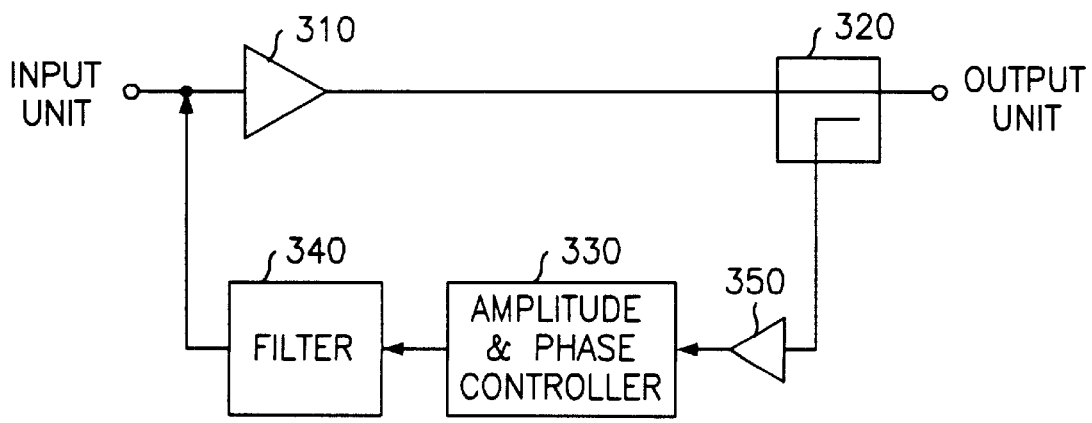
FIG. 3 is a block diagram illustrating a linearizer using a general Cartesian-feedback method.
Figure 4:
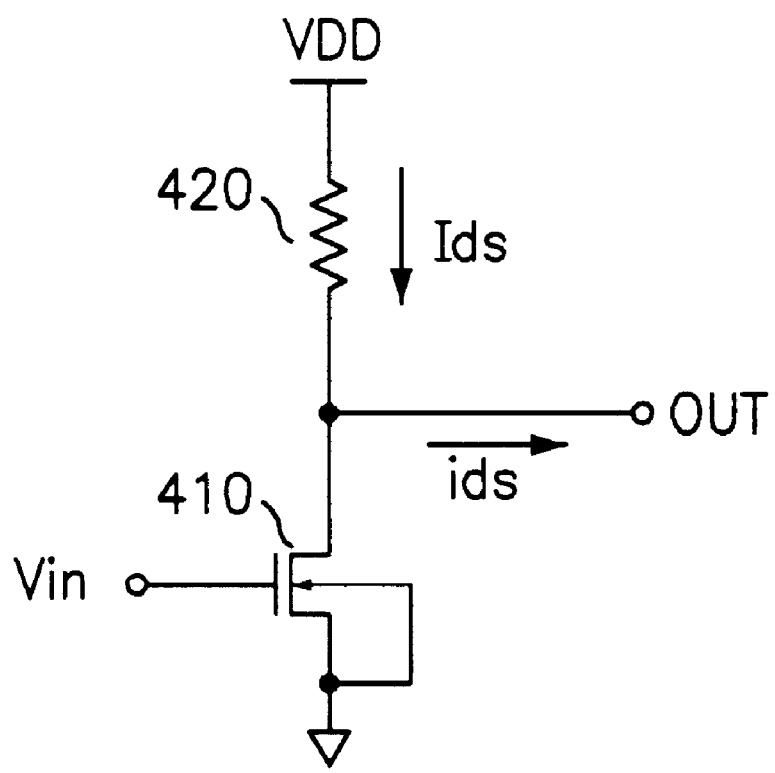
FIG. 4 is a circuit diagram illustrating a NMOS transistor used in the present invention.

FIG. 4 shows a circuit diagram illustrating a NMOS transistor.

Input signal Vin is applied to the gate of the NMOS transistor 410 and power source VDD is applied to the drain of it. A load 420 is connected between the power source and the drain of the NMOS transistor 410 and its source is connected a ground source.

When the input signal Vin over the threshold voltage is applied to the gate of the NMOS transistor 410, the NMOS transistor is turned on, the current Ids applied from the power source VDD flows through the drain of the NMOS transistor to its source.

$$i_{ds} = g_1 \cdot v_{gs}(t) + g_2/2! \cdot v_{gs}(t)^2 + g_3/3! \cdot v_{gs}(t)^3 + \quad (1)$$
$$g_{ds1} \cdot v_{ds}(t) + g_{ds2}/2! \cdot v_{ds}(t)^2 + g_{ds3}/3! \cdot v_{ds}(t)^3 +$$
$$m_{11} \cdot v_{ds}(t) \cdot v_{gs}(t) + m_{12} \cdot v_{ds}(t) \cdot v_{gs}(t)^2 + m_{21} \cdot v_{ds}(t)^2 \cdot v_{gs}(t)$$

Where, $g_1$, $g_2$ and $g_3$ are non-linear elements of transconductance, $g_{ds1}$, $g_{ds2}$ and $g_{ds3}$ are non-linear elements of output transconductance, $m_{11}$, $m_{12}$ and $m_{21}$ are partial derivates related with hybrid signal. If coefficients of the equation (1) are considerably dependent on bias, the operational frequency is low so that the effect of non-linearity of capacitance is not high and if amplitudes of input tone signals of which input frequencies are $\omega_1$ and $\omega_2$ are equal to each other, the third-order distortion signal of current through output unit is proportional to polynomial of voltage gain Av. It can be expressed as the equation (2).

$$i_{ds}(2\omega_1 - \omega_2) \propto \quad (2)$$
$$R_{Leff} \cdot v_{in}(\omega_1)^3 (g_3/3! \cdot v_{gs}(t)^3 + m_{12} \cdot A_v + m_{21} \cdot A_v^2 + g_{ds3}/3! \cdot A_v^3)$$

Where, $$A_v = g_1 \cdot R_{Leff}, R_{Leff} = R_L/(1+R_L \cdot g_{ds1}).$$

The third-order non-linear component $g_{ds2}$ of output conductance in the equation (2) may be disregarded in saturation region. In the integrated circuit for low power, voltage of gate and voltage gain should not be high so that power consumption is low, the third-order distortion signal of the current in the output unit is usually determined according to the value of $g_3$.

Figure 5:
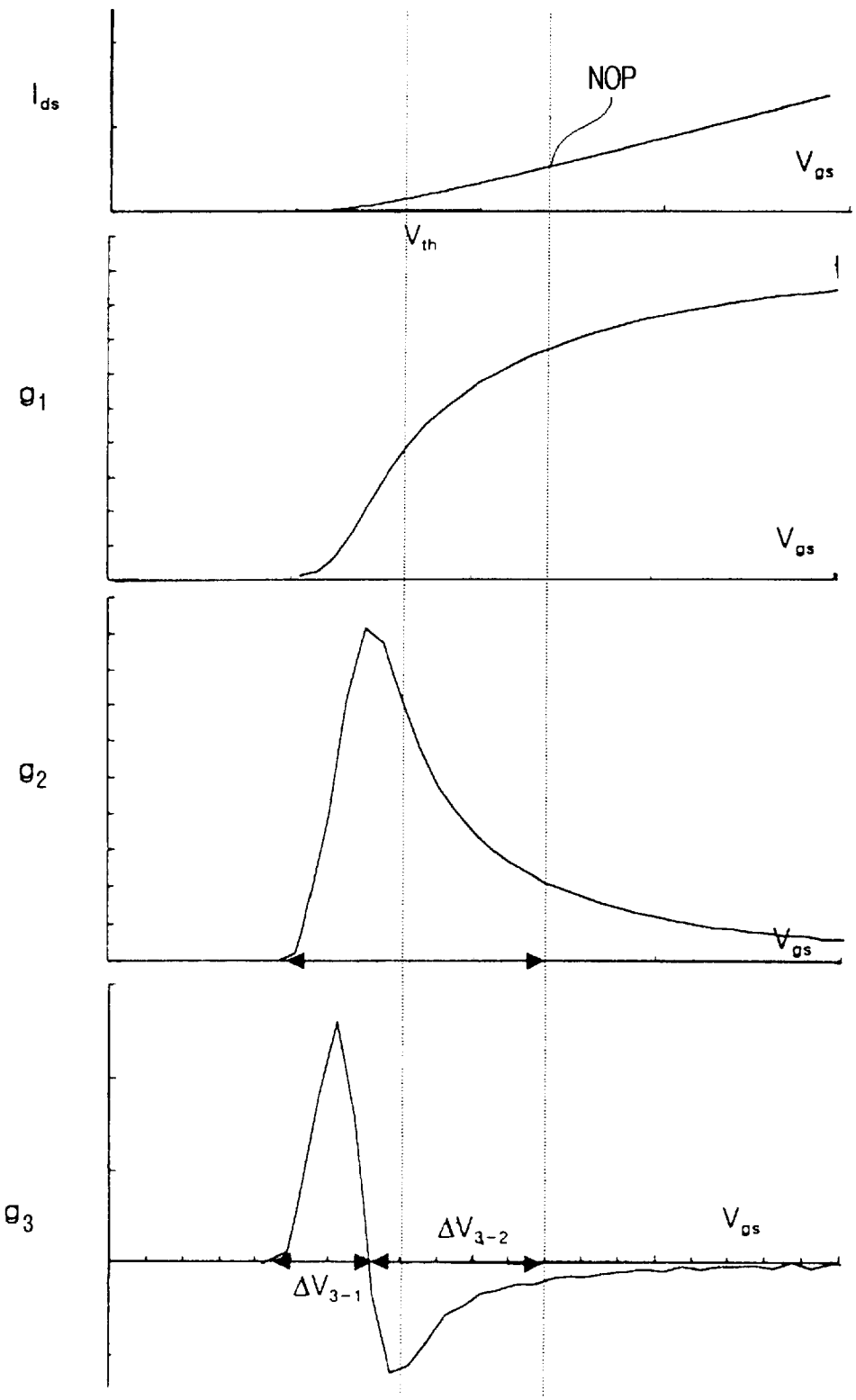
FIG. 5 is a diagram illustrating characteristics of the NMOS transistor in FIG. 4.

FIG. 5 shows a diagram illustrating characteristics of the NMOS transistor in FIG. 4.

Referring to FIG. 5, the value of $g_3$ becomes smaller over the threshold voltage Vth as the gate voltage becomes larger, which shows that linearity increases. The value of power source voltage and the amount of the current are limited by the charging device in the integrated circuit for low power and matching between the integrated elements should be performed in the integrated circuit for radio frequency. Therefore, increase of the linearity is limited because the minimum size of NMOS transistor and the maximum value of the voltage applied to the gate of the NMOS is limited.

If you want to cancel the third-order distortion signal by using feedback, the second-order harmonic frequencies $2\omega_1$, $2\omega_2$ and the third-order distortion signal $2\omega_1-\omega_2$, $2\omega_2-\omega_1$) may be used. When the second-order harmonic frequency of the output unit is fed back to input unit, since the frequency of the second-order harmonic frequency signal is twice as much as that of input signal, it is easy to implement feedback circuit which has the desirable characteristics.

However, since the coefficient of the third-order distortion signal, which is the mixed signal of the second-order harmonic frequencies $2\omega_1$ and $2\omega_2$ fed back to the input unit and the original input signals $\omega_1$ and $\omega_2$ is the third-order term $g_2$ (which creates the second-order harmonic frequency before feedback)×$g_2$ (which is mixed with communication signal after feedback), the coefficient of the mixed third-order distortion signal is much smaller than that of the original third-order distortion signal. Therefore, when the second-order harmonic frequency is fed back, a large gain is necessary to be obtained. Therefore, there is a problem that added circuit and power consumption become large because circuit is amplified using active elements.

When the feedback of the third-order distortion signal is used, since the frequency of the third-order distortion signal is similar to that $\omega_1$ and $\omega_2$ of the communication signal, selection of frequency is impossible. Therefore, since feedback of the communication signal as well as the third-order distortion signal occurs, undesirable interferences with the communication signal occur according to amplitude or phase of feedback. Therefore, in the prior art as mentioned above, additional circuits are necessary to cancel the interferences.

However, in the gate voltage region of $\Delta V_{3-1}$ and $\Delta V_{3-2}$ of FIG. 5, the linear gain of $g_1$ is small, the current consumption is smaller than the normal operation point (NOP), and the size of $g_3$ is large. Since the amplitude of the communication signal is small near the gate voltage region, feedback of only the third-order distortion signal may be performed except feedback of undesirable signal.

Symbols of $g_3$ are contrary to each other in the gate voltage region of $\Delta V_{3-1}$ and $\Delta V_{3-2}$. Therefore, different methods are used for feedback because the phase should be shifted by 180° in $\Delta V_{3-1}$ and $\Delta V_{3-2}$. In general, there are current-serial feedback and voltage-parallel feedback as the simplest feedbacks of the NMOS transistor. In the case of current-serial feedback in which impedance is coupled to the source of the NMOS transistor in serial, effect of the feedback to the output unit is high, but it is difficult for the result of feedback to input unit to be expected. Also, it is difficult to obtain feedback enough to cancel the third-order distortion signal because of serious attenuation of the signal.

In the case of voltage-parallel feedback in which feedback is performed on a load of drain of the NMOS transistor, for cancellation of the third-order harmonic frequency signal, the phase should be shifted by 180° at feedback in the gate voltage region of $\Delta V_{3-1}$. Therefore, 180° phase shifter is required, feedback in the gate voltage region of $\Delta V_{3-1}$ requires an additional circuit which is more complicated than that of feedback in the gate voltage region of $\Delta V_{3-2}$. At the feedback of gate voltage region of $\Delta V_{3-1}$, since the amplitude of g3 is lager and gate voltage is lower in comparison with those of the gate voltage region of $\Delta V_{3-2}$, the power consumption is lower, but gate voltage region is narrower. Therefore, it is difficult for accurate circuit to be implemented.

Figure 6:
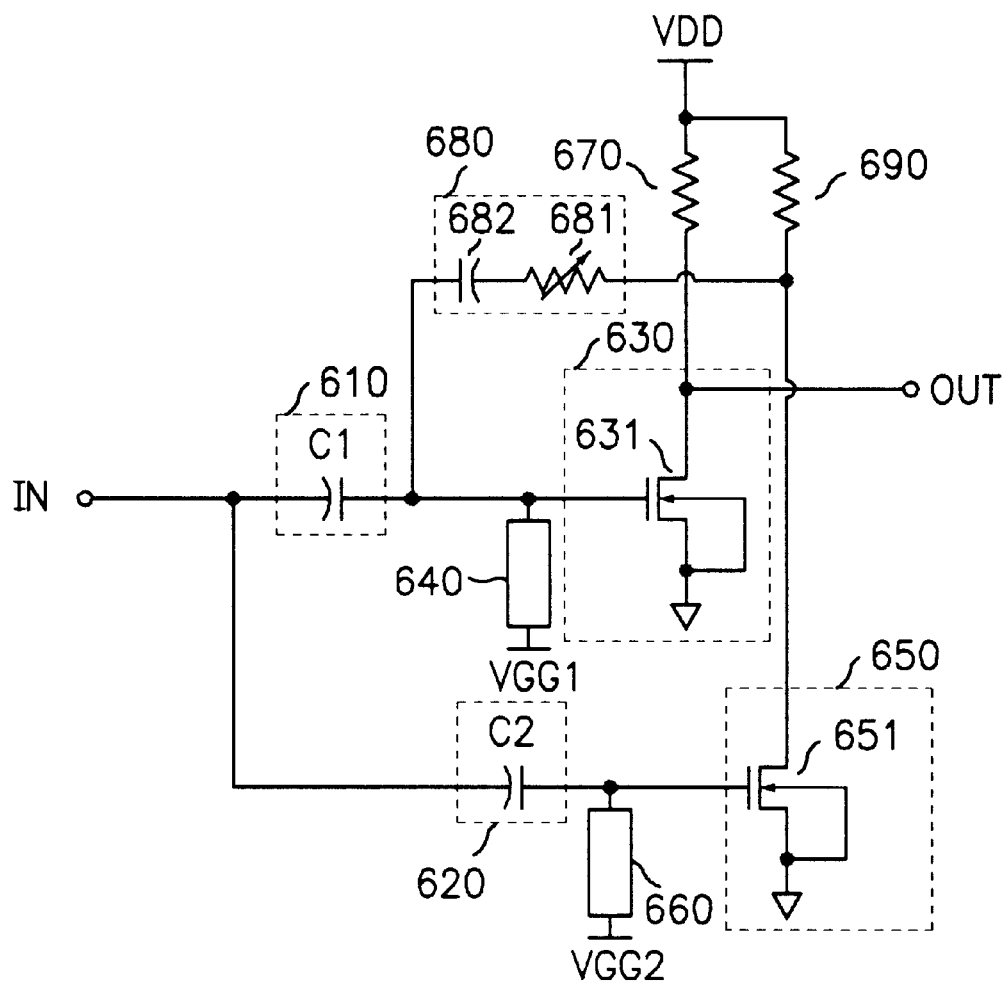
FIG. 6 is a circuit diagram illustrating a small signal linearizer according to an embodiment of the present invention.

FIG. 6 shows a circuit diagram illustrating a small signal linearizer according to an embodiment of the present invention.

Referring to FIG. 6, the small signal linearizer comprises a first and a second DC signal blocking unit 610 and 620, a amplifier 630, a leakage prevention unit of a first input signal 640, a non-liner signal generator 650, a leakage prevention unit of a second input signal 660, loads 670 and 690, and a feedback unit 680.

The first DC signal blocking unit 610, of which one end is connected to the input unit and the other end is connected to the input end of amplifier 630, comprises a capacitor C1 which blocks the DC component of input small signal provided from the input unit and provides the amplifier 630 with only AC component of the input small signal.

The second DC signal blocking unit 620, of which one end is connected to the input unit and the other end is connected to the input end of the non-linear signal generator 650, comprises a capacitor C2 which blocks the DC component of input small signal provided from the input unit and provides the non-linear signal generator 650 with only AC component of the input small signal. The amplifier 630 comprises a NMOS transistor 631 of which the gate is connected to the first DC signal blocking unit 610 and the leakage prevention unit of the first input signal 640, the drain is connected to the load 670 and an output unit OUT, and the source is connected to ground. Here, DC bias VGG1 applied to the gate of NMOS transistor 631 is much higher than the threshold voltage of the NMOS transistor 631.

The leakage prevention unit of the first input signal 640 enables the DC bias VGG1 to be applied to the gate of the NMOS transistor 631 of the amplifier 630 and comprises a resistor, an inductor, etc.

The non-linear signal generator 650 comprises a NMOS transistor 651 of which the gate is connected to the capacitance C2 of the second DC signal blocking unit 620 and the leakage prevention unit of the second input signal 660, the drain is connected to the drain of the NMOS transistor 631 and the source is connected to the ground. Here, DC bias VGG2 applied to the gate of NMOS transistor 651 is slightly higher than the threshold voltage of the NMOS transistor 651.

The leakage prevention unit of the second input signal 660 enables the DC bias VGG2 to be applied to the gate of the NMOS transistor 651 of the amplifier 650 and comprises a resistor, an inductor, etc.

The feedback unit 680 comprises a capacitance 682 and a variable resistor 681 which is connected to the drain of the NMOS transistor 651 of the non-linear signal generator 650 and the gate of NMOS transistor 631 of the amplifier 630. Here, the variable resistor 681 is used to control the amplitude of non-linear signal fed back to the amplifier 630. Meanwhile, if the accurate amplitude of the non-linear signal can be obtained, a desirable amplitude of the non-linear signal may be fed back to the amplifier 630 by using a resistor having a specific amount of capacity instead of the variable resistor.

When a small signal is applied via the input unit IN, the DC signal blocking units 610 and 620 block DC component of the input signal and provide the NMOS transistor 631 of the amplifier 630 and the NMOS transistor 651 of the non-linear signal generator 650 with only AC component of the input signal. At this time, the leakage prevention units 640 and 660 prevent leak of the input signal applied to the NMOS transistors 631 and 651.

The amplifier 630 receives, amplifies and outputs to the output unit the DC bias VGG1. Here, the amplified signal from the amplifier 630 to the output unit has both of the first-order signal which is a linear signal and the second-order and the third-order distortion signal which are non-linear signals. The second-order distortion signal does not interrupt communication system, but the third-order distortion signal does. Therefore, the linearizer according to the present invention generates the non-linear signal having the third-order distortion signal using the non-linear signal generator 630, reverses phase of the third-order distortion signal using the amplifier 630, and then cancels the third-order distortion signal of the non-linear signal outputted from the amplifier 630 using the reversed distortion signal.

The non-linear signal generator 650 receives the DC bias VGG2 and outputs to the feedback unit 680 the non-linear signal having the same phase as the non-linear signal applied from the amplifier 630. The non-linear signal outputted to the feedback unit 680 is fed back to the gate of NMOS transistor 631 of the amplifier 630. The non-linear feedback signal of which phase is reversed is amplified by the amplifier 630 and then cancels the non-linear component of the non-linear signal outputted from the amplifier 630.

Figure 7:
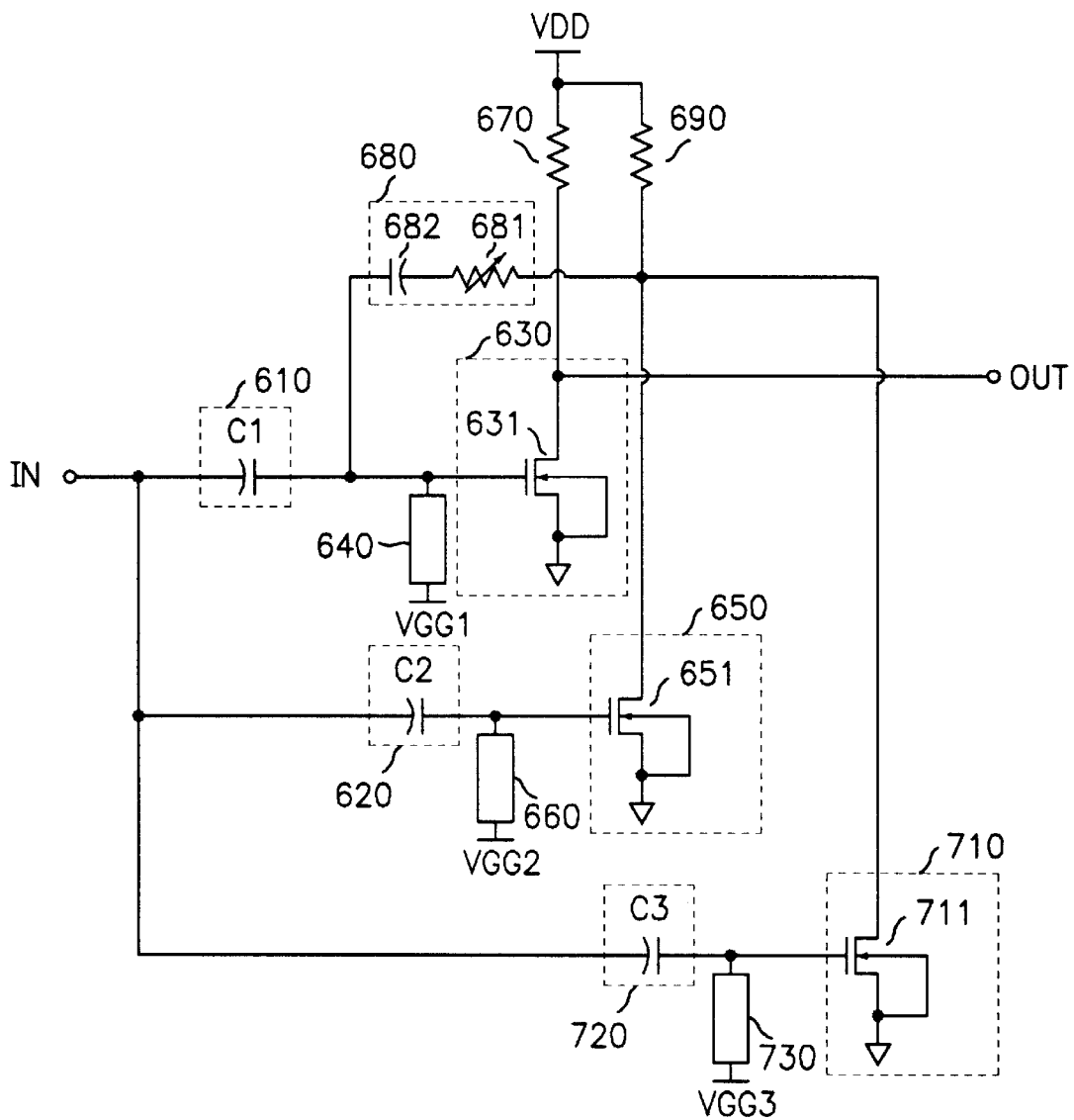
FIG. 7 is a circuit diagram illustrating a small signal linearizer according to another embodiment of the present invention.

FIG. 7 is a circuit diagram illustrating a small signal linearizer according to another embodiment of the present invention.

In this embodiment, the linearizer has the same constitution except from further comprising a non-linear signal generator 710, a third DC signal blocking unit 720 and a leakage prevention unit of third input signal 730.

The non-linear signal generator 710 comprises a NMOS transistor 711 of which drain is connected to the input end of the feedback unit 680, of which gate is connected to the output end of the third DC signal blocking unit 720 and the leakage prevention unit of third input signal 730, and of which source is connected to the ground.

The third DC signal blocking unit 720 comprises a capacitance of which one end is connected to the input unit IN, and of which the other end is connected to the gate of the NMOS transistor 711 and the leakage prevention unit of third input signal 730.

The leakage prevention unit of third input signal 730 comprises a resistor, an inductor, etc.

The linearizer of this embodiment has a large scale, but has a wide region for the cancellation of the non-linear signal, thereby improving the linearity.

The non-linear signal generator may be further added for a purpose.

Figure 8:
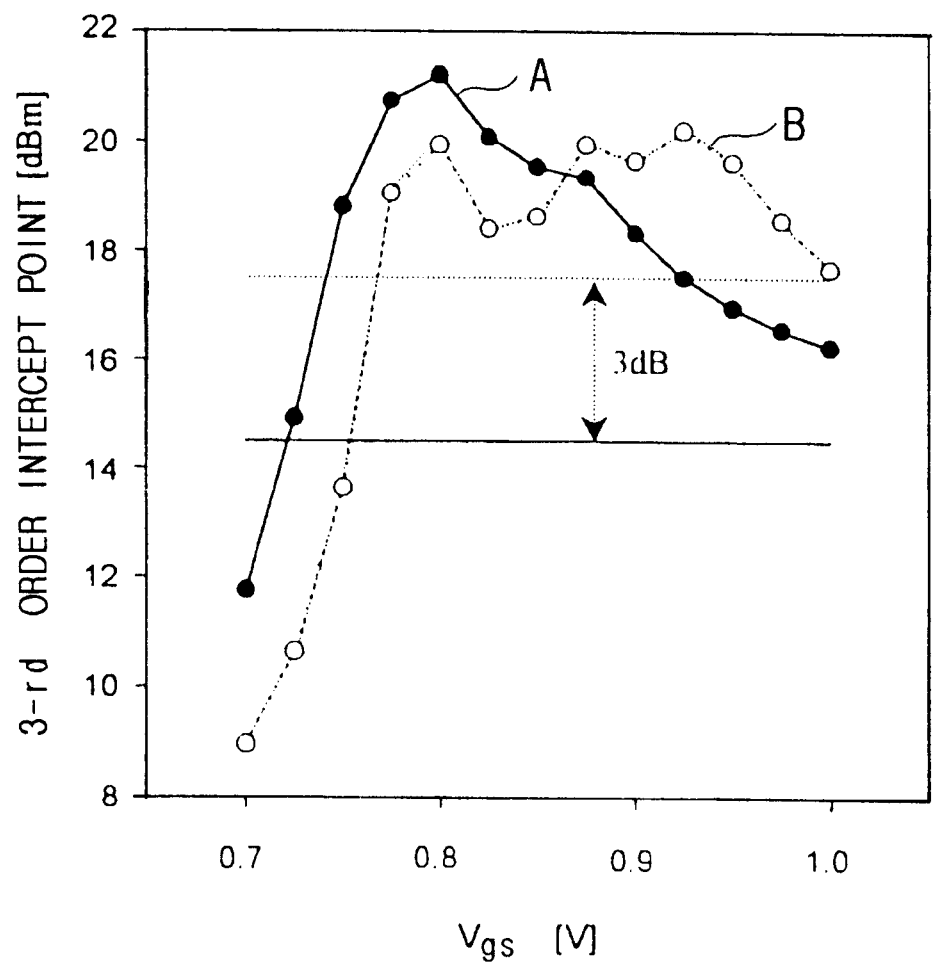
FIG. 8 is a diagram illustrating characteristics of the small signal linearizers in FIGS. 6 and 7.

FIG. 8 is a diagram illustrating characteristics of the small power linearizers in FIGS. 6 and 7.

In FIG. 8, the reference numeral A shows operational characteristic of the small signal linearizer in FIG. 6 and the reference numeral B shows operational characteristic of the small signal linearizer in FIG. 7.

The sizes of the NMOS transistor 631 in FIGS. 6 and 7 are the same as that of the NMOS transistor 410 in FIG. 4. The gate voltage of the NMOS transistor 631 is the same as the NOP.

The small signal linearizer in FIG. 7 is improved in that gate voltage region in which output third-order intercept point (IP3) value is over 3 dB increases and the increased values are uniform. Since increment of the DC power consumption is below 10% where the output value is over 3 dB, the increment of the DC power may be disregarded.

The linearizers according to the present invention have a higher linearity and a simple constitution, and thereby being used for various terminals.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for improving linearity of small signal comprising:

a least of one non-linear signal generating means for receiving a DC bias larger than a threshold voltage and for generating a non-linear signal;

feedback means for returning the non-linear signal from said non-linear signal generating means; and amplifying means for receiving a first DC bias larger than the threshold voltage and the non-linear signal such that the non-linear signal is cancelled.

2. The apparatus as claimed in claim 1, wherein said amplifying means comprises:

a first DC signal blocking means for blocking DC signal of an input signal and transferring only an AC signal of the input signal;

a first input signal leakage prevention means for transferring the first DC bias and for preventing leak of an output signal from the first DC signal blocking means; and an amplifier for receiving the first DC bias from said first input signal leakage prevention means, and for amplifying and outputting to an output unit the input signal from the first input signal leakage prevention means.

3. The apparatus as claimed in claim 2, wherein said amplifier comprises a first NMOS transistor of which a source is connected to a ground, a gate is connected to said first DC signal blocking means and said first input signal leakage prevention means and a drain is connected to said output means, for amplifying the input signal from the first input signal leakage prevention means.

4. The apparatus as claimed in claim 3, wherein said non-linear signal generating means comprises a first and a second non-linear signal generating means each of which is connected to said amplifying means in parallel.

5. The apparatus as claimed in claim 4, wherein said non-linear signal generating means comprises:

a second DC signal blocking means for blocking the DC signal of the input signal and for transferring only the AC signal of the input signal;

a second input signal leakage prevention means for transferring the second DC bias and for preventing leak of output signal from said second DC signal blocking means; and non-linear signal generating means for receiving the first DC bias from a second input signal leakage prevention means and for outputting to said feedback means the non-linear signal having the same phase as that of the amplified signal outputted from said amplifying means.

6. The apparatus as claimed in claim 5, wherein said non-linear signal generating means comprises a second NMOS transistor of which a source is connected to the ground, a gate is connected to said second DC signal blocking means and said second input signal leakage prevention means and a drain is connected to said feedback means, for receiving the second DC bias from said second input signal leakage prevention means, and for outputting to said feedback means the non-linear signal having the same phase as the amplified non-linear signal from said amplifying means.

7. The apparatus as claimed in claim 6, wherein said first DC signal blocking means comprises a first capacitance of which one end is connected to said input means and the other end is to the gate of the first NMOS transistor.

8. The apparatus as claimed in claim 7, wherein said second DC signal blocking means comprises a second capacitance of which one end is connected to an input means and the other end is connected to the gate of the second NMOS transistor.

9. The apparatus as claimed in claim 8, wherein said first and said second input signal leakage prevention means each comprises a resistor and an inductor.

* * * * *